United States Patent [19]
Nelson

[11] Patent Number: 5,521,549
[45] Date of Patent: May 28, 1996

[54] STABILIZATION OF CLOSED-LOOP POWER CONTROLLERS

[76] Inventor: Robert G. Nelson, 8142 Garland Rd., Dallas, Tex. 75218

[21] Appl. No.: 277,246

[22] Filed: Jul. 19, 1994

Related U.S. Application Data

[63] Continuation-in-part of Ser. No. 7,521, Jan. 22, 1992, Pat. No. 5,352,986.

[51] Int. Cl.$^6$ .................................................. H03F 3/38
[52] U.S. Cl. ................................................ 330/10; 330/107
[58] Field of Search ............................. 330/10, 107, 109, 330/207 A, 251

[56] References Cited

U.S. PATENT DOCUMENTS

| | | | |
|---|---|---|---|
| 4,178,556 | 12/1979 | Attwood | 330/10 |
| 4,531,096 | 7/1985 | Yokoyama | 330/10 |
| 5,218,315 | 6/1993 | Turner | 330/10 |
| 5,352,986 | 10/1994 | Modgil et al. | 330/10 |

Primary Examiner—Steven Mottola
Attorney, Agent, or Firm—W. J. Scherback

[57] ABSTRACT

A closed-loop power control system includes an analog input and an analog output. An analog signal applied to the analog input is summed with an analog signal derived from the analog output to produce a difference signal representative of the polarity of the difference between the analog input signal and the derived analog output signal. A digital signal is produced representative of the polarity of the difference signal. The system includes at least two switching networks, having high energy outputs, and which are responsive to the digital signal to reduce the levels of the difference signal in a frequency band of interest at the source of the digital signals. A low-pass filter is included between the high energy outputs and the means to produce the digital signal to attenuate high frequency noise. The phase lag created by a low-pass passive filter at the output of the high energy outputs is, in one embodiment, reduced by a high-pass filter to maintain stability. Instability that may occur in the presence of large amplitude signals is avoided by the use of a clipping circuit.

16 Claims, 7 Drawing Sheets

STABILIZATION OF CLOSED-LOOP POWER CONTROLLERS

CROSS REFERENCE TO RELATED APPLICATION

This is a continuation-in-part of U.S. patent application Ser. No. 08/007,521 filed Jan. 22, 1992 for Closed-Loop Power Controller now U.S. Pat. No. 5,352,986, issued Oct. 4, 1994.

BACKGROUND OF THE INVENTION

1. Field of the Invention

This invention relates to methods and apparatus for stabilizing closed-loop power controllers which controllers utilize switching techniques.

2. Discussion of the Prior Art

Because of their high efficiency, switching amplifiers are widely used to control power, for example, as audio amplifiers and motor controllers. Switching amplifiers are distinguished from linear amplifiers in that they amplify by using devices which switch at a frequency higher than the analog frequency of interest with such switching characteristics related to the analog signal being amplified. These switching amplifiers can be classified many ways, but for the present purpose, they are classified as open-loop and closed-loop power controllers. Closed-loop power controllers are distinguished from open-loop power controllers in that they use some form of feedback. This feedback is normally used to enhance the output linearity and signal-to-noise ratio.

Switching amplifiers normally use a passive low-pass filter between the power switching devices and the load to separate the lower frequency information contained in the switched output from the higher frequency switching energy. For example, when a switching amplifier is used to drive a speaker with audio signals, the passive filter would be designed to pass the highest audio frequency of interest while attenuating the switching energy and other high frequency noise to prevent electro-magnetic interference to other equipment. In this case a higher order low-pass filter would be more desirable than a simpler low-pass filter, because of the greater attenuation that would occur to the unwanted higher frequencies.

Another advantage of the passive filter is its attenuation of the error components outside of the frequency band of interest as seen at the means that controls the switching circuits. This process improves the analog output signal-to-noise ratio and linearity. Often, in addition to the passive filter, additional filtering, as described in pending parent U.S. patent application, Ser. No. 08/007,521, is added elsewhere in the loop to enhance the linearity and signal-to-noise ratio of the analog output. In all cases the total amount of filtering or phase shift in the loop must be controlled to prevent instability.

The point from which feedback can be taken varies considerably. Closed-loop power controllers can take feedback from the output of the power switching devices as in U.S. Pat. Nos. 3,294,981, and 5,218,315, from the output of the passive filter (as in the above identified pending patent application), from the output of one of the stages of the passive filter as in U.S. Pat. No. 4,178,556), or from a combination of the above as described in U.S. Pat. No. 4,456,872.

In the cases where feedback is taken after one or more stages of passive filtering, it might be necessary to reduce the phase shift caused by the passive filter, either because the passive filter provides too much phase shift to the closed loop or because it is desirable to add an additional filter with more desirable characteristics. For example, the use of feedback originating after a fourth-order passive filter would normally cause instability and result in undesirable oscillations in the amplifier. Even if the desired output passive filter would not by itself cause instability in the closed loop, it might be desirable to add another complex low-pass filter, such as an active low-pass filter, in the closed loop at a point other than between the power switching networks and the analog output. Such a complex low-pass filter could have characteristics not easily obtained with a passive filter at the output. However, this complex low-pass filter, along with the output passive filter, might have so much phase lag as to cause instability of the closed loop. It is possible to bypass the output passive filter and provide feedback from the output of the power switching networks, but this method might undesirably reduce the switching amplifier's output impedance and damping factor.

Additionally, a switching amplifier's best linearity and signal-to-noise ratio occurs when the gain and phase characteristics of the closed-loop system cause the amplifier to operate near instability. Under these conditions of near instability, it is possible for the amplifier to become unstable during a power-on condition or because of an abnormally large signal or noise. Once the amplifier enters the unstable state of large signal oscillation, then one or more normally linear amplifiers are operating part of the time non-linearly and the closed loop system might not return to stability. Accordingly, there is a need to return an amplifier from an unstable state to a stable operating condition.

In view of the foregoing, it is an object of the present invention to provide high-efficiency, stable power controllers with enhanced signal-to-noise ratios and high linearity.

SUMMARY OF THE INVENTION

In accordance with the present invention, there is provided a closed-loop power control system, including an analog input and an analog output. An analog signal applied to the analog input is summed with an analog signal derived from the analog output to produce a difference signal representative of the polarity of the difference between the analog input signal and the derived analog output signal. A digital signal is produced representative of the polarity of the difference signal. The system includes at least two switching networks, having high energy outputs, and which are responsive to the digital signals to reduce the levels of the difference signal in a frequency band of interest at the source of the digital signals. A low-pass filter is included between the high energy outputs and the means to produce the digital signal to attenuate high frequency noise. The phase lag created by a low-pass passive filter at the output of the high energy outputs is, in one embodiment, reduced by a high-pass filter to maintain stability.

In another embodiment, if instability occurs, the phase lag of large amplitude signals is reduced by a means responsive only to those large amplitude signals to return the closed-loop system to a normal stable condition.

DETAILED DESCRIPTION

Figure 1:
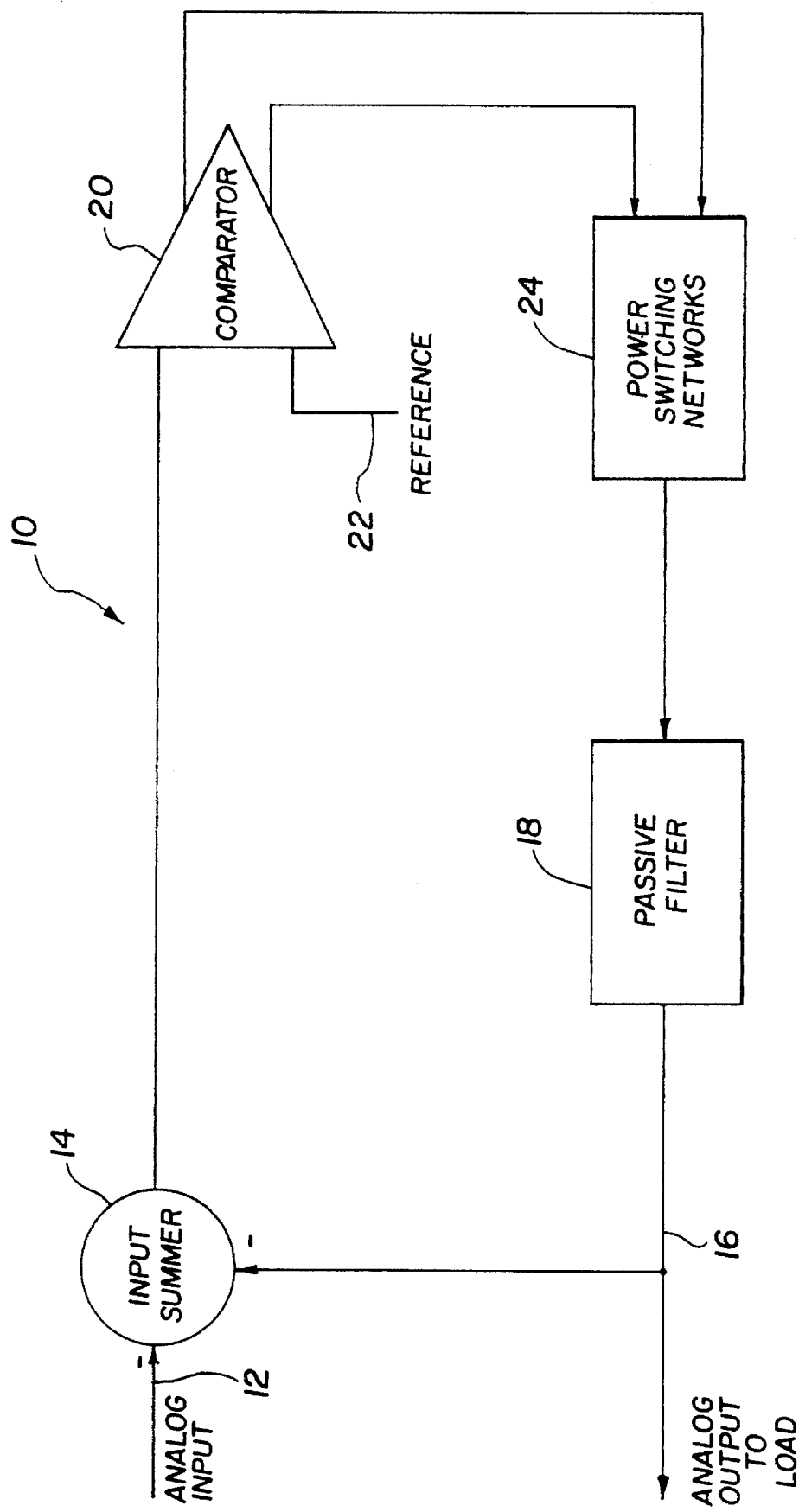
FIG. 1, is a block diagram of a power controller of the prior art.

Referring now to FIG. 1, there is illustrated a closed-loop power controller 10, of the prior art commonly referred to as a switching amplifier. The power controller 10 comprises an analog input 12 which is summed by input summer 14 with an analog output 16 derived from a passive filter 18 to obtain the difference between the analog input and the analog output. The difference signal is applied to a voltage comparator 20 where it is compared with a signal from reference 22 to create a digital signal which is representative of the polarity of the difference signal. The digital signal at the output of the voltage comparator 20 is applied to power switching networks 24 comprised of a least two power transistors responsive to the digital signals such that the power switching output is a low-impedance, high energy signal that is either high or low. The output of the power switching networks 24 is filtered by the low-pass passive filter 18 comprised of one or more inductors and/or capacitors. The passive filter 18 is designed to efficiently remove the high frequency switching energy and reconstruct a high energy version of the analog input. Variations of this design are numerous. Further specific details are not necessary since the art is well known.

It is desirable to minimize the high frequency energy present at the analog output so that it does not have to be absorbed by the load and so that electro-magnetic interference is minimized by preventing high-frequency energy from reaching and radiating from the load and the wires connecting to the load. This high frequency energy is normally considered to be all frequencies above the analog frequency band of interest up to and including the switching frequency and its harmonics. The switching frequency is normally at least twice the highest frequency in the band of interest.

One method to attenuate these unwanted higher frequencies is to make the low-pass passive filter of a higher and higher order by using multiple stages of an inductor-capacitor type filter. However, the increased filter order results in an increased phase lag which can easily result in an unstable closed-loop system.

Figure 2:
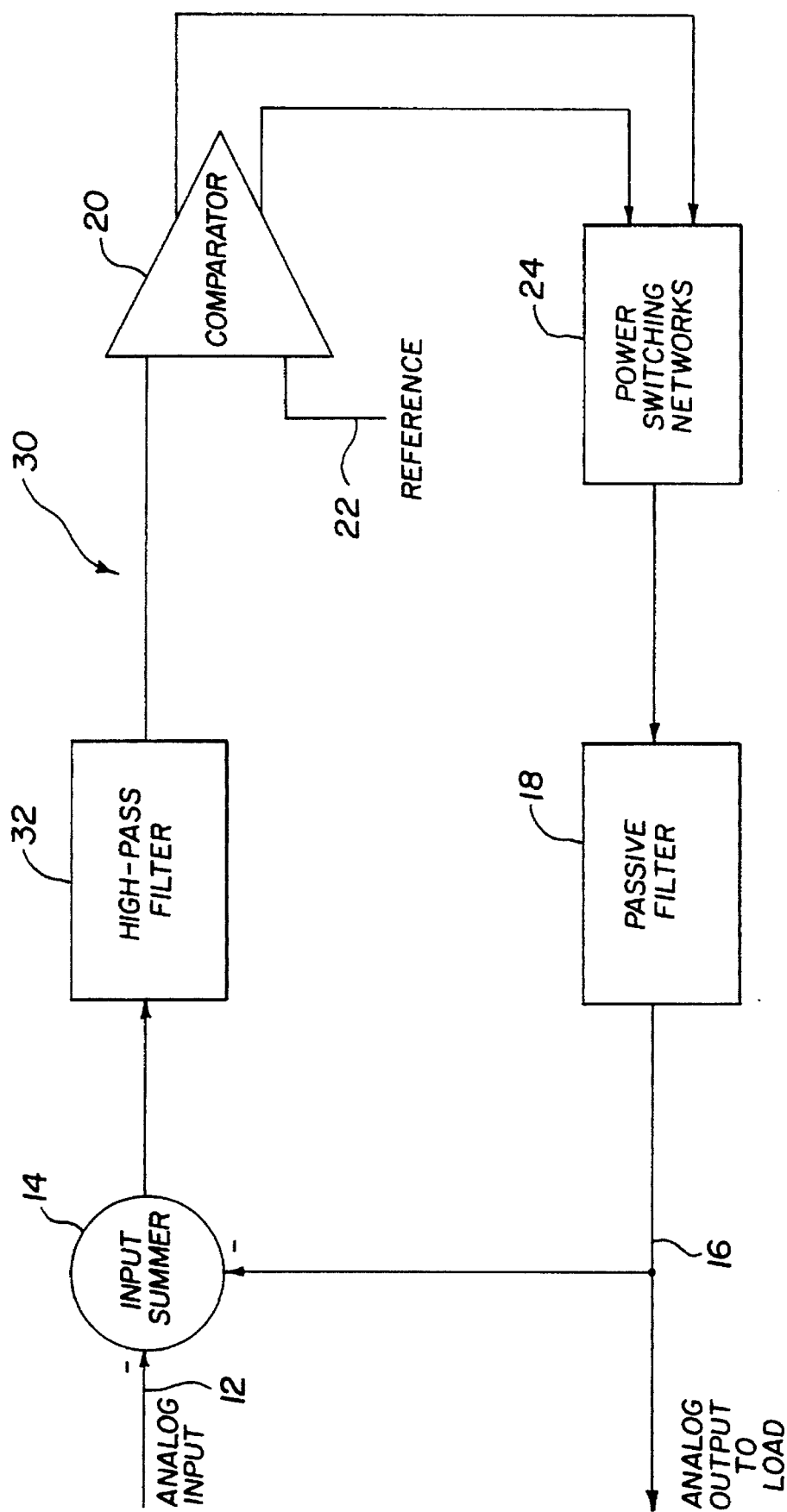
FIG. 2, is a block diagram of a modification of the present invention illustrating the presence of a high-pass filter.

FIG. 2 illustrates a closed-loop power controller 30 of the present invention. It is similar to the controller 10 of FIG. 1 with an input summer 14, a comparator 20, a power switching networks 24, a passive filter 18, an analog input 12, and an analog output 16 being the same as that of FIG. 1 except that a high-pass filter 32 has been added between the input summer 14 and the comparator 20. The high-pass filter 32 preferably is active, the design of which is straight forward to one skilled in the art. The high-pass filter 32 will have one or more zeros to match one or more poles of the low-pass passive filter 18 such that the phase lag in the closed loop is reduced to an amount which provides stability. For example, if the low-pass passive filter 18 is of the fourth order, then the high-pass filter 32 will be of the third order to ensure stability. The high-pass filter 32 can be located elsewhere in the loop of controller 30 such as between the analog output 16 and the input summer 14.

Figure 3:
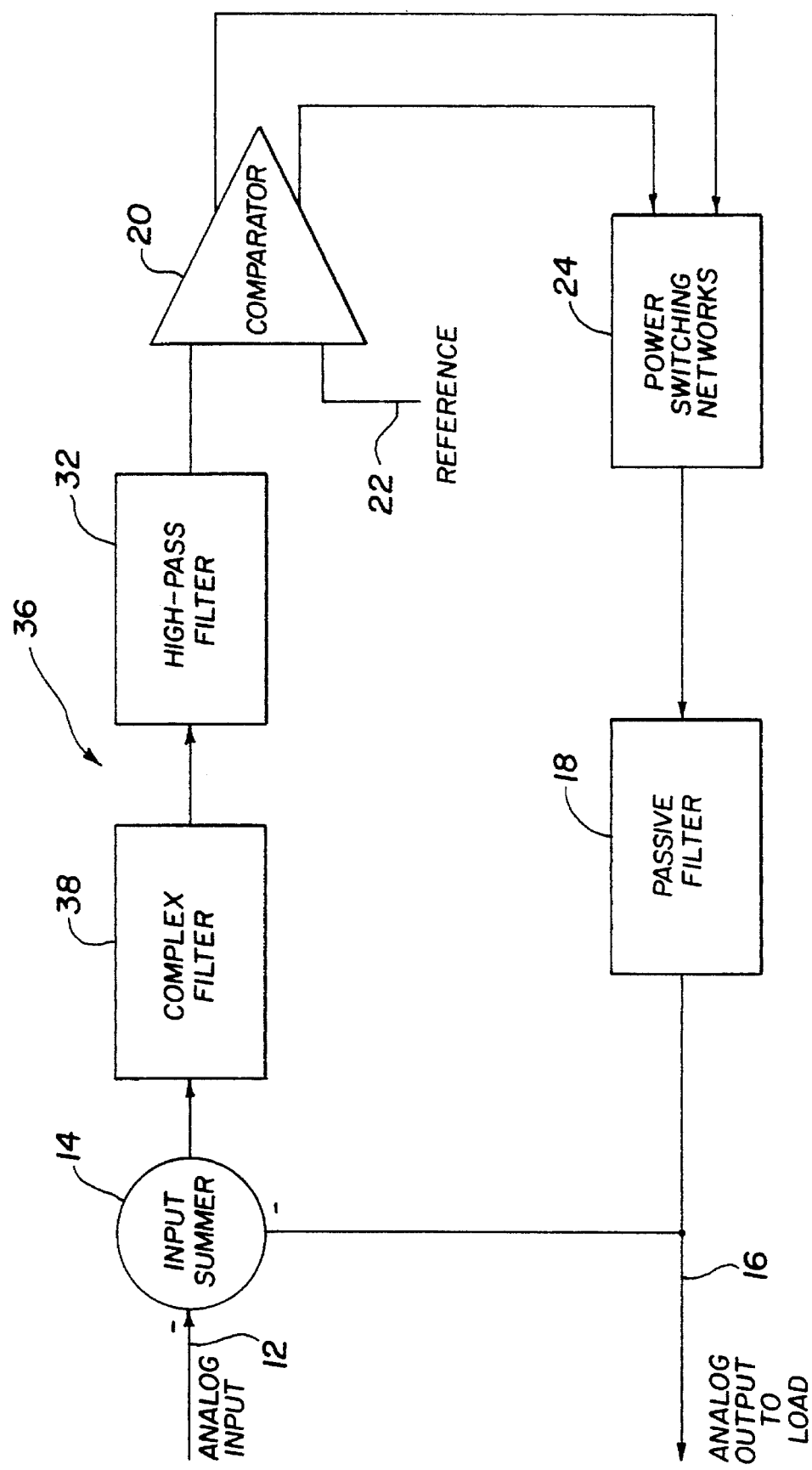
FIG. 3, is a block diagram of a modification of the present invention illustrating the presence of a high-pass filter and a complex low-pass filter.
Figure 7:
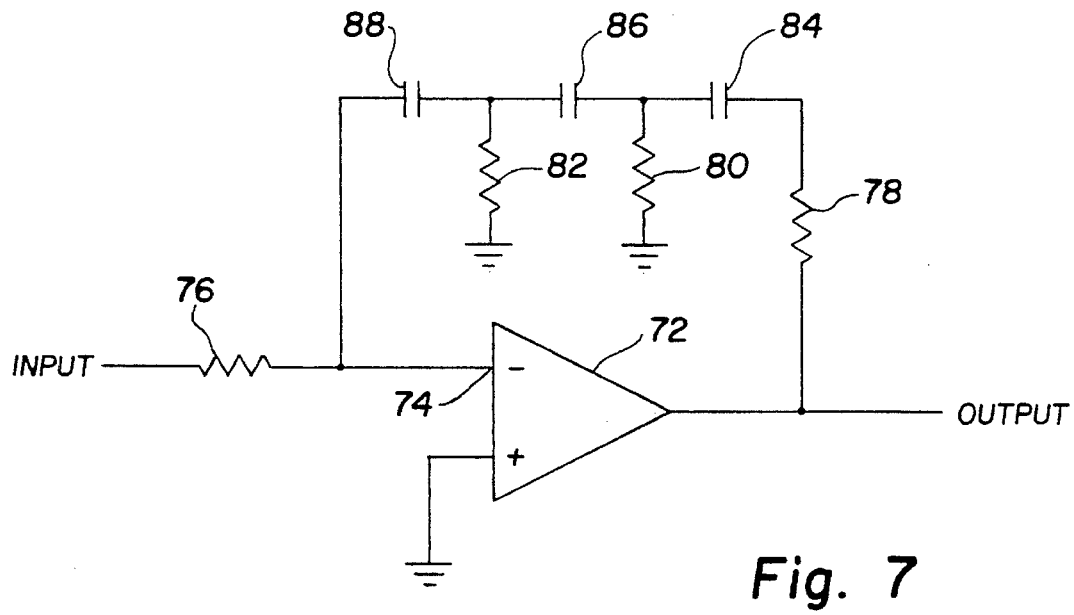
FIG. 7, illustrates a circuit schematic of a complex low-pass filter.

FIG. 3 illustrated a closed-loop power controller 36 similar to the controller 30 of FIG. 2 with the input summer 14, the comparator 20, the power switching network 24, the passive filter 18, the analog input 12, the analog output 16 and the high-pass filter 32 being the same. A complex low-pass filter 38 has been added between the input summer 14 and the high-pass filter 32. By the term complex filter is meant a filter with multiple poles. The complex filter 38 can preferably be an active filter, the design of which is straight forward to those skilled in the art. The purpose of the complex filter 38 is to provide a low-pass filter characteristic, such as that of a third-order underdamped filter of the type shown in FIG. 7. When the phase lag of the low-pass passive filter 18 is added to the phase lag of the additional filter 38 such as the complex third-order filter of FIG. 7, then it is again apparent that the high-pass filter 32 will be necessary to reduce the phase lags caused by the low-pass passive filter 18 and avoid instability of the controller 36. The complex filter 38 might be located elsewhere in the loop such as between the analog output 16 and the input summer 14. Additionally, the low-pass complex filter 38 and the high-pass filter 32 might be combined, in whole or in part, into a single filter function. The complex filter of FIG. 7 is illustrative only and was derived from copending U.S. patent application Ser. No. 08/007,521. (See FIG. 8. of that application) It is easy to see that numerous combinations might be possible.

Figure 4:
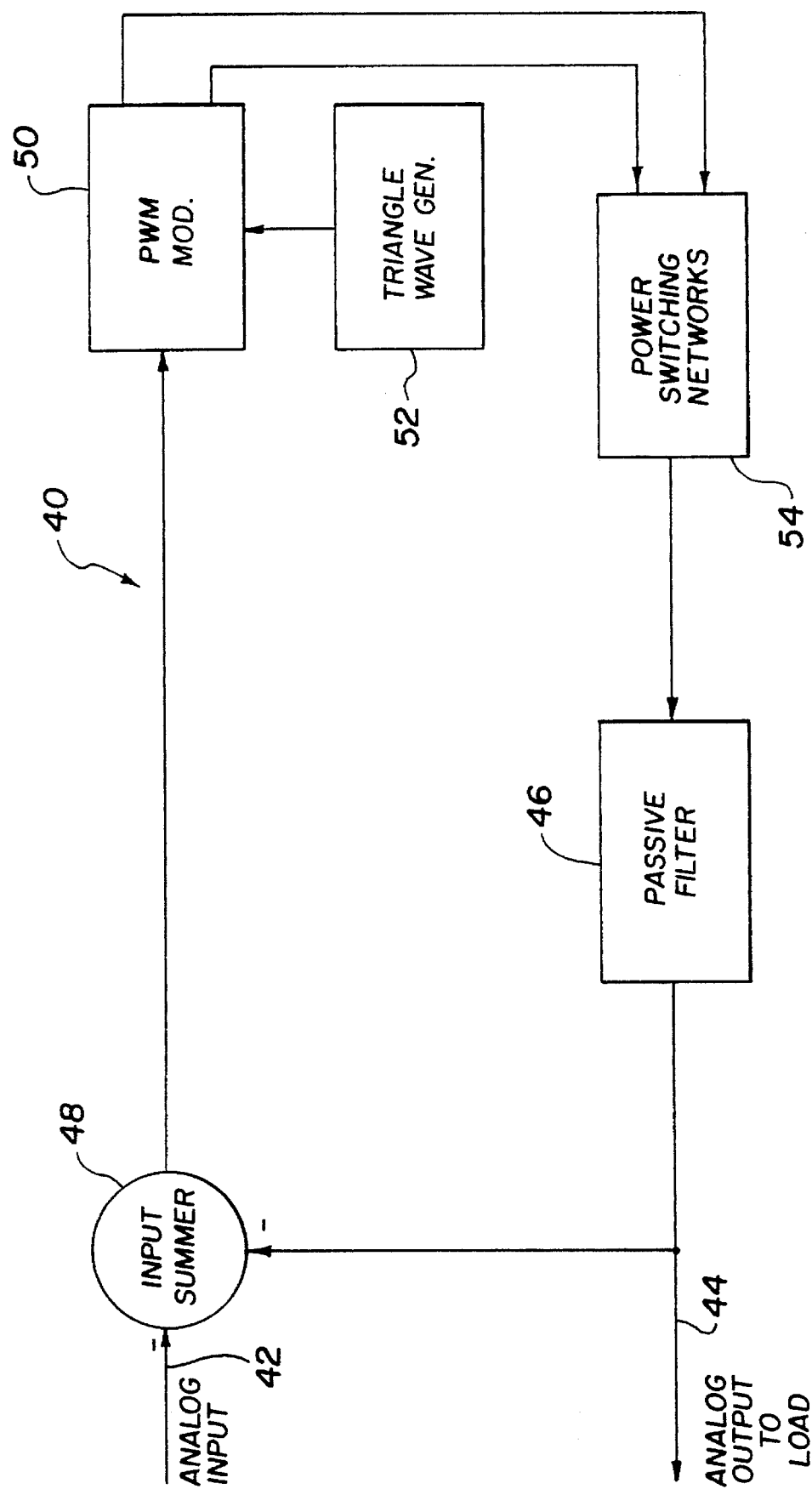
FIG. 4, is a block diagram of an alternate form of a power controller of the prior art.

FIG. 4 illustrates a prior art closed-loop power controller 40 commonly referred to as a pulse-width-modulator switching amplifier. The power controller 40 comprises an analog input 42 which is summed with an analog output 44 derived from a passive filter 46 by input summer 48 to obtain the difference between the analog input 42 and the analog output 44. The difference signal is applied to a pulse-width-modulator 50 where it is compared with the wave form generated by a triangle wave generator 52. The triangle wave generator 52 may have a frequency of about 400 kHz when the analog output frequency band of interest goes to 20 kHz. The pulse-width-modulator 50 may be comprised of a level comparator adapted to compare the level of the difference signal with that of the reference triangle-wave signal to generate a rectangular wave pulse-width modulated signal whose pulse width varies according to the instantaneous amplitude level and polarity of the modulating difference signal. The pulse width modulated signal is used to drive power switching networks 54 which are similar to the power switching networks used in FIGS. 1, 2, and 3. Again, the output of the power switching networks 54 is filtered by the low-pass passive filter 46 consisting of one or more inductors and/or capacitors. The passive filter 46 is designed, as before, to efficiently remove the high frequency switching energy and reconstruct a high energy version of the analog input. Variations of this design are numerous and specific details are well known in the art.

Figure 5:
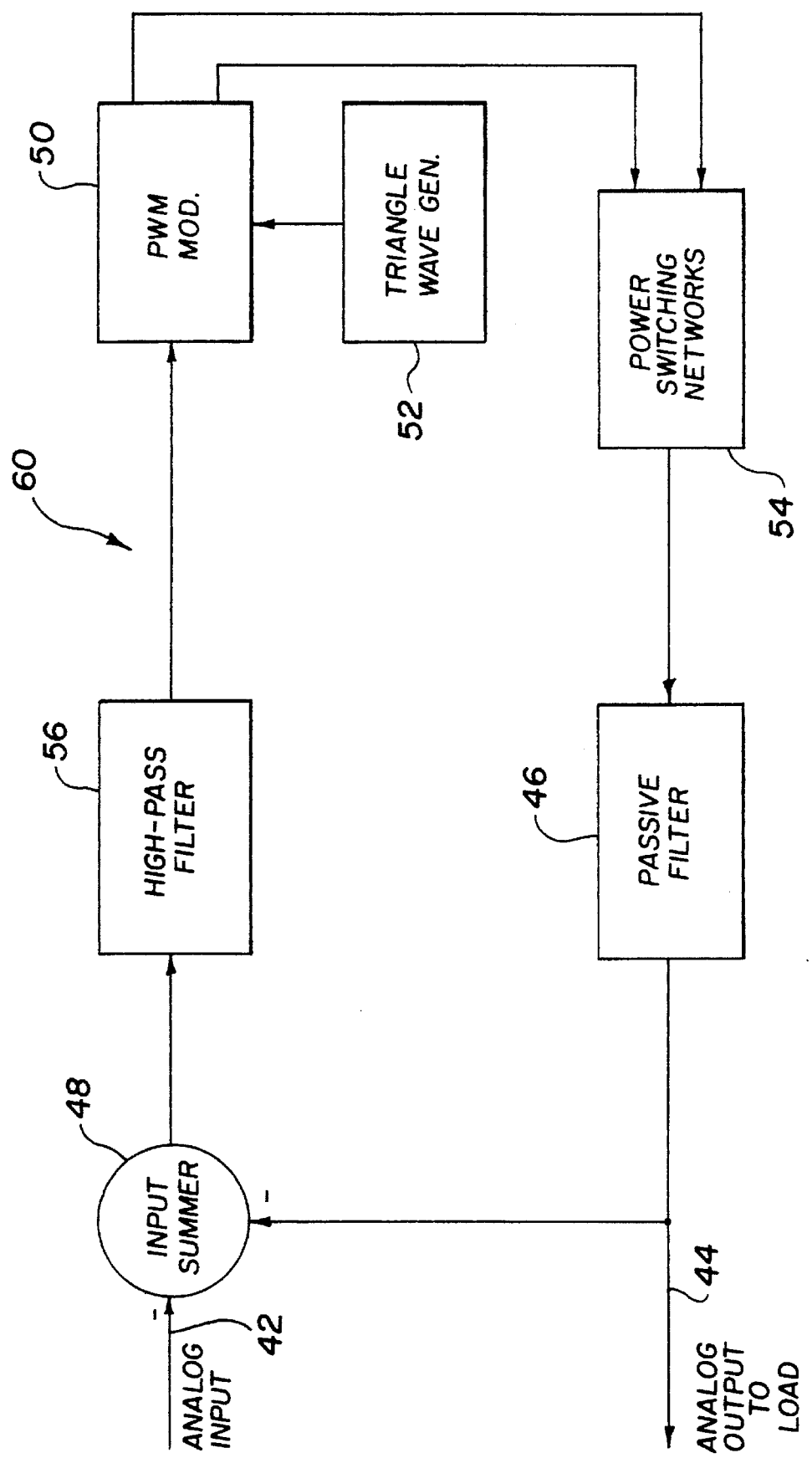
FIG. 5, is a block diagram of a modification of FIG. 4 in accordance with the present invention including the presence of a high-pass filter.

The considerations for attenuating the high frequency switching energy for the pulse-width-modulator switching amplifier 40 are similar to those of the switching amplifiers depicted in FIGS. 1, 2, and 3. FIG. 5 is a modification of FIG. 4, made in accordance with present invention. Specifically a high-pass filter 56 is added to the amplifier 60. The input summer 48, the pulse-width-modulator 50, the triangle-wave generator 52, the power switching networks 54, the low-pass passive filter 46, the analog input 42 and the analog output 46 remaining the same as that in FIG. 4. As before, the high-pass filter 56 preferably is active, the design of which is straight forward to one skilled in the art. The high-pass filter 56 will have one or more zeros to match one or more poles of the low-pass passive filter 46 such that the phase lag in the closed loop is reduced to an amount which provides stability. For example, if the low-pass passive filter 46 is of the fourth order, then the high-pass filter would be, for example, of the third order to ensure stability. The high-pass filter 56 could be located elsewhere in the loop such as between the analog output 44 and the input summer 48.

Figure 6:
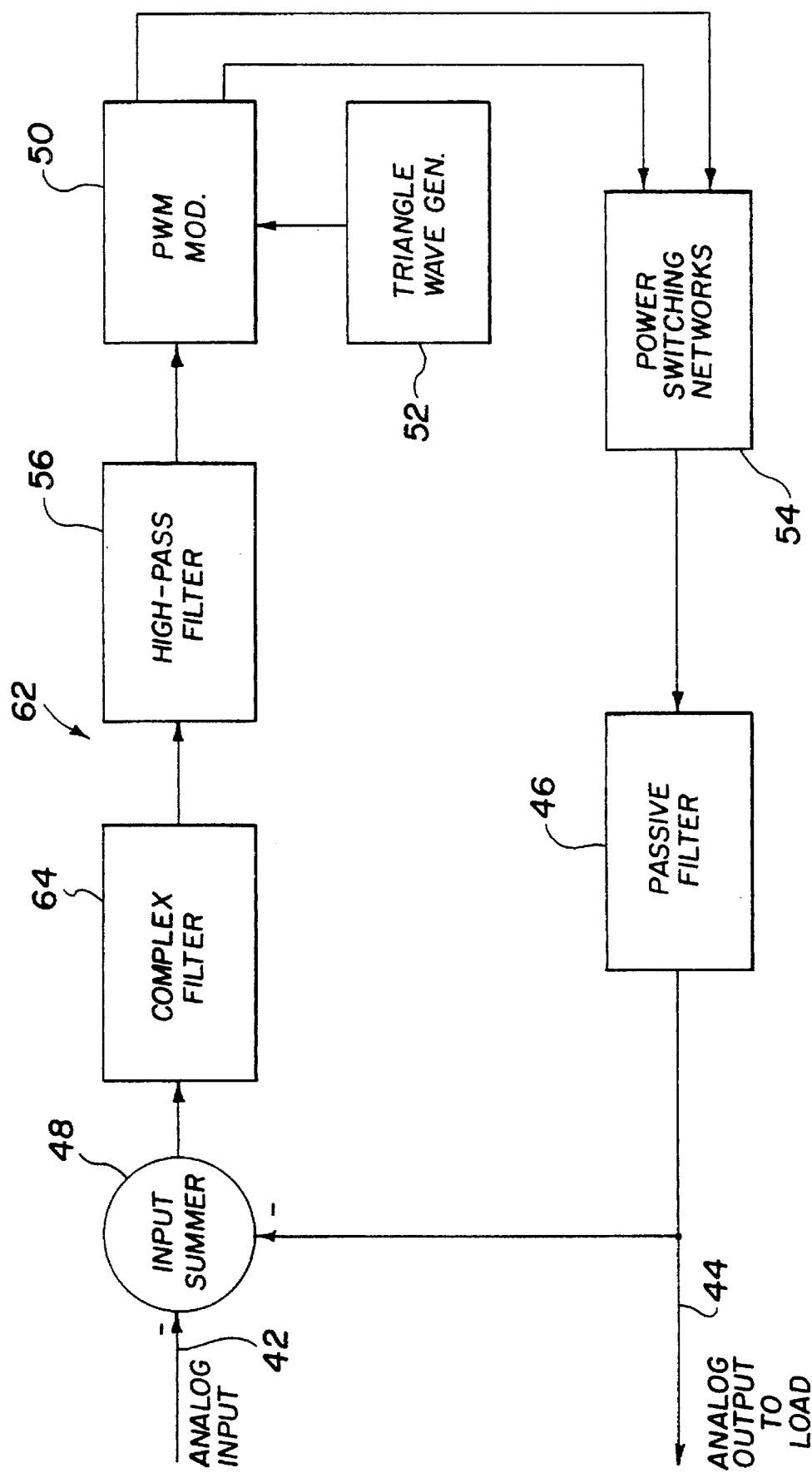
FIG. 6, is a block diagram of a modification of FIG. 4 in accordance with the present invention illustrating the presence of a high-pass filter and a complex low-pass filter.

In FIG. 6 is illustrated in block schematic a closed-loop power controller 62 similar to 60 in FIG. 5 with the input summer 48, the pulse-width-modulator 50, the triangle-wave generator the power switching network 54, the low-pass passive filter 46, the analog input 42, analog 44 output and the high-pass filter 56 being the same. In accordance with the present invention a complex low-pass filter 64 has been added between the input summer 48 and the high-pass filter 56. The complex filter 64 can be active or passive, the design of which is straight forward to one skilled in the art. The purpose of the complex filter is to provide a low-pass filter characteristic, such as the third-order underdamped filter (FIG. 7). When the phase lag of the low-pass passive filter 46 is added to the phase lag of an additional filter such as the complex third-order filter 64, it is apparent that the high-pass filter will be necessary to reduce the phase lags caused by the low-pass passive filter 46. The complex filter might be located elsewhere in the loop such as between the analog output 44 and the input summer 48; or after the high-pass filter 56. Additionally, the low-pass complex filter 64 and the high-pass filter 56 might be combined, in whole or in part, into one single filter function. The actual characteristics of the complex filter is not part of this invention and the example in FIG. 7 is illustrative only and was derived from copending U.S. patent application Ser. No. 08/007,521. It is easy to see that numerous combinations might be possible.

In FIG. 7 there is illustrated a suitable complex filter 70 which is a third-order underdamped low-pass filter. The filter consists of operational amplifier 72 of a common integrated type, having an analog input 74 connected to an input resistor 76 and with a negative feedback network comprised of resistors 78, 80, and 82, and capacitors 84, 86, and 88. The output is applied to the next stage of the closed-loop power controller or on where it is placed in the closed loop. The purpose of the complex filter is to more optimally enhance the analog output linearity and signal-to-noise ratio.

Figure 8:
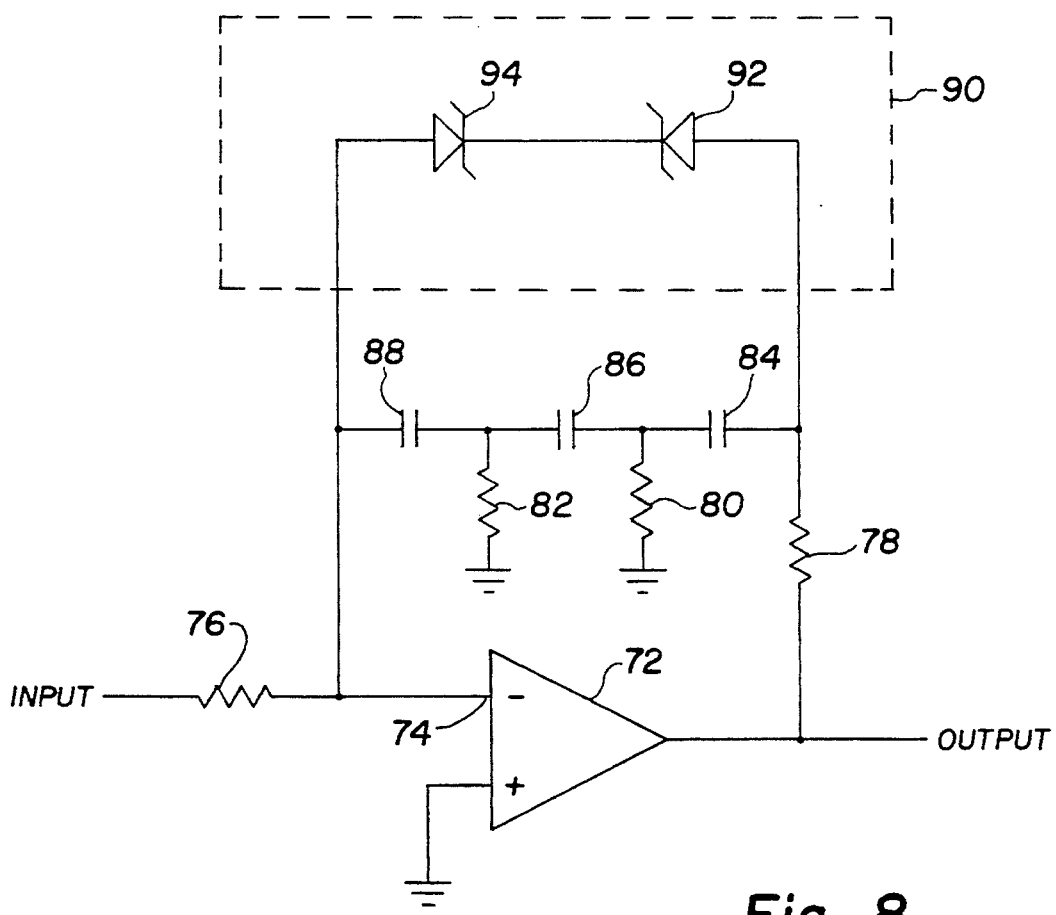
FIG. 8, illustrates a circuit schematic of a modification of the complex low-pass filter of FIG. 7 including a clipping circuit.

Because a switching amplifier's best linearity and signal-to-noise ratio will occur when the gain and phase characteristics of the closed-loop system causes the amplifier to operate near instability, shown in FIG. 8 is apparatus for reducing the phase lag of large amplitude signals. If the closed-loop system should go into oscillation upon power-on or with large amplitude signals such that the linear amplifiers go into saturation, then a clipping circuit 90 will provide an alternate signal path to the large amplitude signals such that the capacitors 84, 86, and 88 are bypassed and the phase lag caused by those capacitors is reduced for those large signals. The clipping circuit 90 is comprised of two zener diodes 92 and 94 whose zener voltages are less than the operational amplifiers power supply voltages. For example, if the operational amplifier use plus and minus fifteen volt power supplies, then the zener voltages would be set at ten volts to ensure that the diodes 92 and 94 conduct before the operational amplifier goes into saturation.

While the invention has been illustrated and described in detail in the drawings and foregoing description, the same is considered as illustrative and not restrictive in character, it being understood that only the preferred embodiments have been shown and described and that all changes and modifications that occur to those skilled in the art are intended to be within the scope of the appended claims.

What is claimed is:

1. A closed-loop system, having an analog input and an analog output, for controlling power comprising, means to sum a signal applied to the analog input with a signal derived from the analog output to produce a difference signal representative of the polarity of the difference between said analog input signal and said derived analog output signal;

means for producing a digital signal representative of the polarity of said difference signal;

at least two switching networks, said switching networks having high energy outputs and being responsive to said digital signals, to reduce the level of said difference signal in the frequency band of interest at the means for producing the said digital signals;

a low-pass filter at least of the third order between said high energy outputs and the said analog output to attenuate high-frequency noise, and a high pass filter of at least the second order between said analog output and the inputs to said switching networks to reduce the phase lag in the loop.

2. A closed-loop system, having an analog input and an analog output, for controlling power comprising, means to sum a signal applied to the analog input with a signal derived from the analog output to produce a difference signal;

means for generating a reference signal, comparison means for comparing said difference signal with said reference signal to produce a digital signal representative of the polarity difference between said difference signal and said reference signal;

at least two switching networks, said switching networks having high energy outputs representative of said digital signal, to reduce the level of said difference signal in the frequency band of interest at the means for producing the said digital signal;

a low-pass filter at least of the third order between said high energy outputs and the said analog output to attenuate high-frequency noise, and a high pass filter of at least the second order between said analog output and the inputs to said switching networks to reduce the phase lag in the loop.

3. A closed-loop system, having an analog input and an analog output for controlling power comprising, means to sum a signal applied to said analog input with a signal derived from said analog output to produce a difference signal representative of the polarity of the difference between said analog input signal and said derived analog output signal, means for producing a digital signal representative of the polarity of said difference signal, at least two switching networks, said switching networks having high energy outputs and being responsive to said digital signals to reduce the level of said difference signal in a frequency band of interest at the means for producing the said digital signals, a low-pass filter between said high energy outputs and said analog output to attenuate high-frequency noise, a low-pass filter at least of the third order in the closed loop to enhance the signal-to-noise ratio at said analog output, and a high-pass filter of at least the second order between said analog output and the inputs to said switching networks to reduce the phase lag in the loop.

4. A closed-loop system, having an analog input and an analog output, for controlling power comprising, means to sum a signal applied to the analog input with a signal derived from the analog output to produce a difference signal;

means for generating a reference signal;

comparison means for comparing said difference signal with said reference signal to produce a digital signal representative of the polarity difference between said difference signal and said reference signal;

at least two switching networks, said switching networks having high energy outputs representative of said digital signal, to reduce the level of said difference signal in the frequency band of interest at the means for producing the said digital signal;

a low-pass filter between said high energy outputs and the said analog output to attenuate high-frequency noise;

a low-pass filter at least of the third order in the closed loop to enhance the signal-to-noise ratio, and a high pass filter of at least the second order between said analog output and the inputs to said switching networks to reduce the phase lag in the loop.

5. A closed-loop system as set forth in claims 1, 2, 3, or 4 which include a means to reduce the phase lag of large amplitude signals.

6. A closed-loop system, having an analog input and an analog output, for controlling power comprising, means to sum a signal applied to the analog input with a signal derived from the analog output to produce a difference signal representative of the polarity of the difference between said analog input signal and said derived analog output signal;

means for producing a digital signal representative of the polarity of said difference signal;

at least two switching networks, said switching networks having high energy outputs and being responsive to said digital signals, to reduce the level of said difference signal in the frequency band of interest at the means for producing the said digital signals;

a low-pass filter at least of the third order between said high energy outputs and said means of producing the said digital signal to attenuate high-frequency noise, and means to reduce the phase lag of large amplitude signals.

7. A closed-loop system, having an analog input and an analog output, for controlling power comprising, means to sum a signal applied to the analog input with a signal derived from the analog output to produce a difference signal;

means for generating a reference signal;

comparison means for comparing said difference signal with said reference signal to produce a digital signal representative of the polarity difference between said difference signal and said reference signal;

at least two switching networks, said switching networks having high energy outputs representative of said digital signal, to reduce the level of said difference signal in the frequency band of interest at the means for producing the said digital signal;

a low-pass filter between said high energy outputs and said means for producing said digital signal to attenuate high-frequency noise;

a low-pass filter at least of the third order in the closed loop to enhance the signal to noise ratio, and means to reduce the phase lag of large amplitude signals.

8. A closed-loop switching amplifier including an analog input and an analog output, high energy switching networks having inputs and outputs, a low-pass filter at least of the third order between said high energy switching outputs and said analog output, and a high-pass filter at least of the second order between said analog output and said inputs to said high energy switching networks to reduce the phase lag in the loop.

9. A closed-loop switching amplifier including an analog input and an analog output, high energy switching networks having inputs and outputs, a low-pass filter at least of the third order in the closed loop, and a high-pass filter at least of the second order between said analog output and said inputs to said high energy switching networks to reduce the phase lag in the loop.

10. A closed-loop system as set forth in claims 8 or 9 which include means to reduce the phase lag of large amplitude signals.

11. A closed-loop switching amplifier including an analog input and an analog output, high energy switching networks having inputs and outputs, a low-pass filter at least of the third order between said high energy switching outputs and said analog output, and means to reduce the phase lag of large amplitude signals in the analog frequency band of interest.

12. A closed-loop switching amplifier including an analog input and an analog output and further including a low-pass filter at least of the third order in the closed hoop and means to reduce the phase lag of large amplitude signals in the analog frequency band of interest.

13. A closed-loop system as set forth in claims 6, 7, 11, or 12 in which said means to reduce the phase lag of large amplitude signals is a clipping circuit which provides a signal path to bypass filter components.

14. The closed-loop system of claim 2 in which said means for generating a reference signal is a triangle-wave generator and said comparator is a pulse width modulator.

15. A closed-loop system as set forth in claim 5 in which said means to reduce the phase lag of large amplitude signals is a clipping circuit which provides a signal path to bypass filter components.

16. A closed-loop system as set forth in claim 10 in which said means to reduce the phase lag of large amplitude signals is a clipping circuit which provides a signal path to bypass filter components.

* * * * *